(12) United States Patent
Pelella

(10) Patent No.: US 7,075,155 B1
(45) Date of Patent: Jul. 11, 2006

(54) STRUCTURE FOR PROTECTING A SEMICONDUCTOR CIRCUIT FROM ELECTROSTATIC DISCHARGE AND A METHOD FOR FORMING THE STRUCTURE

(75) Inventor: Mario M. Pelella, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 42 days.

(21) Appl. No.: 10/866,114

(22) Filed: Jun. 14, 2004

(51) Int. Cl.
*H01L 23/62* (2006.01)

(52) U.S. Cl. ............... 257/355; 257/360; 438/282; 438/152; 438/155

(58) Field of Classification Search ........ 257/409–412, 257/490, 355, 360; 438/282, 152, 155
See application file for complete search history.

(56) References Cited

U.S. PATENT DOCUMENTS

| | | | |
|---|---|---|---|
| 6,278,164 B1 * | 8/2001 | Hieda et al. | |
| 6,326,270 B1 * | 12/2001 | Lee et al. | |
| 6,333,538 B1 * | 12/2001 | Hosotani et al. | |
| 6,399,431 B1 | 6/2002 | Song et al. | |
| 6,406,948 B1 | 6/2002 | Jun et al. | |
| 6,452,234 B1 | 9/2002 | Mahanpour | |
| 6,486,515 B1 | 11/2002 | Jun et al. | |
| 6,498,372 B1 | 12/2002 | Brown et al. | |
| 6,531,741 B1 | 3/2003 | Hargrove et al. | |
| 6,552,372 B1 | 4/2003 | Wu et al. | |
| 6,624,487 B1 * | 9/2003 | Kunz et al. | ............... 257/409 |
| 6,664,599 B1 | 12/2003 | Chen et al. | |
| 6,765,264 B1 * | 7/2004 | Xhang et al. | |

* cited by examiner

*Primary Examiner*—Fetsum Abraham

(57) ABSTRACT

A structure for protecting a semiconductor circuit from electrostatic discharge is provided. The structure comprises a semiconductor substrate of a first conductivity type having two wells of a second conductivity type spaced laterally apart. The wells each comprise a first portion having a first concentration of an impurity of the second conductivity type and a second portion comprising source and drain regions having a second concentration of an impurity of the second conductivity type. The second concentration is greater than the first concentration. The wells are implanted in the substrate of a silicon-on-insulator semiconductor device. Conductive plugs extend through the silicon and insulator layers and make electrical contact with the wells, allowing the dissipation of excess current and heat into the semiconductor substrate.

23 Claims, 8 Drawing Sheets

STRUCTURE FOR PROTECTING A SEMICONDUCTOR CIRCUIT FROM ELECTROSTATIC DISCHARGE AND A METHOD FOR FORMING THE STRUCTURE

FIELD OF THE INVENTION

The present invention relates to the fabrication of semiconductor devices, and more particularly, to a structure for protecting semiconductor devices from electrostatic discharges using silicon-on-insulator (SOI) technology and a method of forming an electrostatic discharge protection structure.

BACKGROUND OF THE INVENTION

Modern high-density integrated circuits are vulnerable to damage from the electrostatic discharge (ESD) of a charged body as it physically contacts the integrated circuit. ESD damage occurs when the amount of charge exceeds the capability of a conduction path through the integrated circuit. A typical ESD failure mechanism includes thermal runaway resulting in junction shorting and dielectric breakdown resulting in gate-junction shorting. ESD can result from either automated or human handling. If the ESD voltage applied to a gate insulator is excessive the gate oxide can break down. Metal oxide semiconductor field effect transistor (MOSFET) devices are particularly vulnerable to ESD damage.

To avoid damage from ESD, integrated circuits typically incorporate ESD protection devices at each external terminal. ESD protection devices generally operate by providing a high capacity conduction path, so that brief but massive ESD charge may be safely conducted away from structures that are not capable of handling the discharge. Inputs and outputs typically have a separate ESD protection device added in parallel to the terminal.

There is a continuing drive in the semiconductor industry to fabricate devices exhibiting increased performance and decreased power consumption. Planar transistors, such as MOSFETs are particularly well suited for use in high density integrated circuits. As the size of MOSFETs and other devices decrease, the dimensions of source/drain regions, channel regions, and gate electrodes also decreases.

The miniaturization of planar transistors of short channel lengths require very shallow source/drain junctions to avoid lateral diffusion of implanted dopant which causes leakage currents and poor breakdown performance. Shallow source/drain junction, on the order of 1,000 Å or less, are generally required for acceptable performance of short channel devices. SOI technology allows the formation high-speed, shallow-junction devices. In addition, SOI devices improve performance by reducing parasitic junction capacitance.

A SOI structure has semiconductor devices formed on a substrate in which a buried insulator region limits the depth of the active regions. SOI provides significant advantages over bulk technologies. Among its technological benefits, SOI provides reduced short channel effects, reduced electric field strength, reduced parasitic capacitance, higher speed and lower power consumption.

While SOI devices enable the production of higher density integrated circuits, SOI devices are more vulnerable to damage from ESD. The SOI layer is much thinner than a bulk silicon substrate and therefore, has lower current carrying capability and lower resistance to heating than bulk silicon substrates. ESD causes severe localized heating which can break down oxides and consequently damage SOI circuits. The buried oxide layer in a SOI device inhibits the conduction of heat away from the SOI circuits, leading to thermally induced damage of the SOI circuits.

SUMMARY OF THE INVENTION

There exists a need for methodology enabling the fabrication of SOI semiconductor devices that exhibit improved resistance to the effects of electrostatic discharge. There exists a need for methodology to prevent the damaging build up of heat in SOI semiconductor devices. There exists a particular need for ESD protection in SOI devices. There also exists a need for an improved method of forming ESD protection structures in semiconductor devices.

These and other needs are met by a structure for protecting a semiconductor device from electrostatic discharge. The structure comprises a semiconductor substrate comprising a substrate layer of the first conductivity type having two wells of a second conductivity type spaced laterally apart. The wells each comprise a first portion having a first concentration of an impurity of the second conductivity type, and a second portion comprising source and drain regions having a second concentration of an impurity of the second conductivity type. The second concentration is greater than the first concentration. A first insulting layer is formed over the semiconductor substrate and a silicon layer comprising silicon regions is formed over the first insulating layer. First and second conductive plugs extend through the first insulating layer and silicon layer and are in electrical contact with the source and drains regions, respectively.

The above needs are also met by a method of forming a structure for protecting a semiconductor circuit from electrostatic discharge. The method comprises providing a silicon-on-insulator semiconductor substrate comprising a substrate layer of a first conductivity type, a silicon layer comprising silicon regions, and a first insulating layer interposed between the silicon layer and the substrate layer. Two wells of a second conductivity type are formed spaced laterally apart in the substrate layer. The wells each comprise a first portion having a first concentration of an impurity of the second conductivity type. A second portion comprising source and drain regions having a second concentration of an impurity of the second conductivity type is formed in the wells. The second concentration is greater than the first concentration. First and second conductive plugs are formed extending through the silicon layer and the first insulating layer and in electrical contact with the source and drain regions respectively.

The present invention addresses the needs for an improved SOI semiconductor device with improved electrostatic discharge protection.

The foregoing and other features, aspects, and advantages of the present invention will become apparent in the following detailed description of the present invention when taken in conjunction with the accompanying drawings.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, in which like reference numerals are employed throughout to designate similar features, wherein.

DETAILED DESCRIPTION OF THE INVENTION

Figure 1:
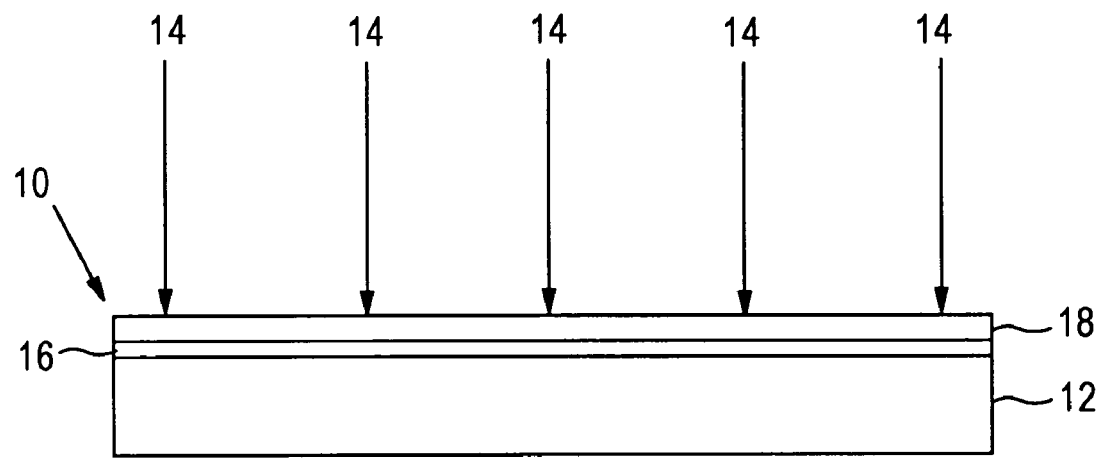
FIGS. 1–12 schematically illustrate the formation of a structure for protecting a SOI semiconductor device from electrostatic discharge according to one embodiment of the instant invention.

The present invention enables the protection of improved high-speed, high-density, SOI semiconductor devices with improved resistance to the damaging effects of electrostatic discharges. The present invention provides improved resistance to oxide breakdown resulting from electrostatic discharge. The present invention further improves dissipation of heat from the SOI layer by conducting the heat to the silicon substrate. These benefits are provided by incorporating in a semiconductor device an electrostatic discharge protection structure that conducts excess charge and heat to the bulk silicon substrate.

The term semiconductor devices, as used herein, is not be limited to the specifically disclosed embodiments. Semiconductor devices, as used herein, include a wide variety of electronic devices including MOSFETs, flip-chip, flip-chip/package assemblies, transistors, capacitors, microprocessors, random access memories, bipolar devices, light emitting diode devices, etc. In general, semiconductor devices refer to any electrical device comprising semiconductors.

The embodiments of the present invention will be described in conjunction with the formation of the semiconductor devices illustrated in the accompanying drawings. However, this is exemplary only as the claimed invention is not limited to the formation of the specific devices illustrated in the drawings.

A semiconductor substrate 10 is provided as shown in FIG. 1. Semiconductor substrate 10 comprises a substrate layer 12, such as a silicon wafer, with a first insulating layer 16 formed thereon. A layer of silicon 18 overlies the first insulating layer 16 to form a SOI structure. The SOI structure may be formed by any method known to one of ordinary skill in the art, such as by the SIMOX (separation by implanted oxygen) method, wafer bonding (i.e.—bonding a semiconductor wafer to an insulator layer that has been formed by growing a thermal oxide on a bulk semiconductor substrate), or the epitaxial growth of silicon on an insulating layer. FIG. 1 illustrates the formation of a buried oxide (BOX) layer 16 by the SIMOX process. In the SIMOX process, oxygen ions 14 are implanted into the semiconductor substrate 10 to form a BOX layer 16. In certain embodiments of the instant invention, the oxygen ions 14 are implanted into the semiconductor substrate 10 at an energy in the range of from about 70 keV to about 200 keV and at a dose in the range of from about $1.0 \times 10^{17}$ $cm^{-2}$ to about $1.0 \times 10^{18}$ $cm^{-2}$. The semiconductor substrate 10 is subsequently annealed at a temperature in the range of from about 1250° C. to about 1400° C. for about 6 hours in an atmosphere comprising an inert gas and from about 0.2% to about 2.0% $O_2$ to form the BOX layer.

Figure 2:
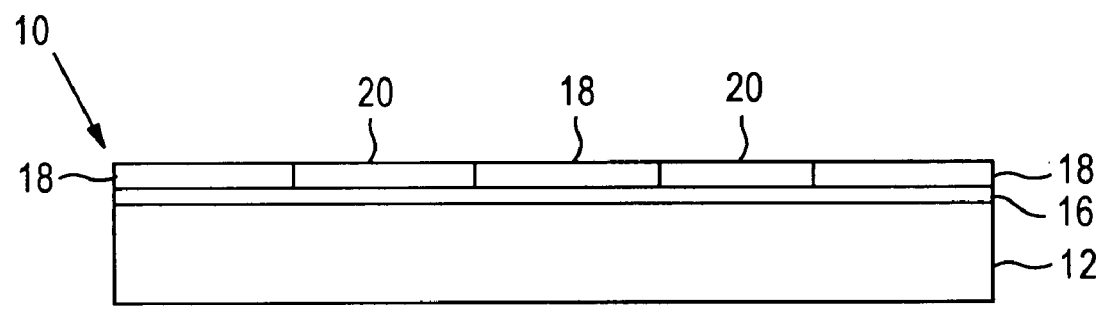

As shown in FIG. 2, a second insulating layer 20 is formed to be substantially coplanar with silicon regions in the silicon layer 18. The second insulating layer comprises at least 2 laterally spaced regions 20. In certain embodiments of the invention, the second insulating layer is formed using shallow trench isolation (STI) techniques. In a certain embodiment of the present invention, the second insulating layer 20 comprises silicon oxide.

Figure 3:
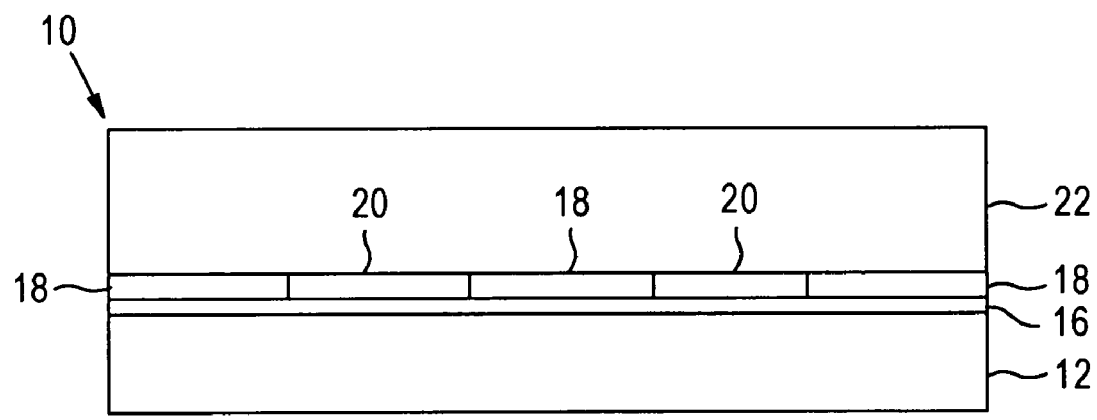
Figure 4:
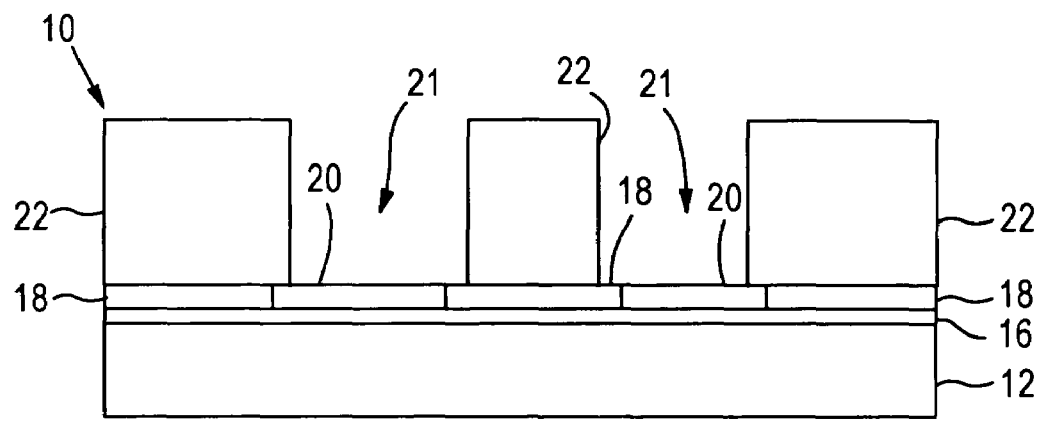

Subsequent to the formation of the second insulating layer, a resist layer 22, such as a photoresist, is formed over the silicon layer 18 and second insulating layer 20, as shown in FIG. 3. The resist layer 22 is patterned, such as by photolithographic patterning, to form two openings 21 spaced laterally apart such that portions of the second insulating layer 20 and portions of silicon layer 18 between the two second insulating layers 20 are exposed, as shown in FIG. 4. The patterned resist layer 22 overhangs a portion of the second insulating layer 20, as illustrated in FIG. 4.

Figure 5:
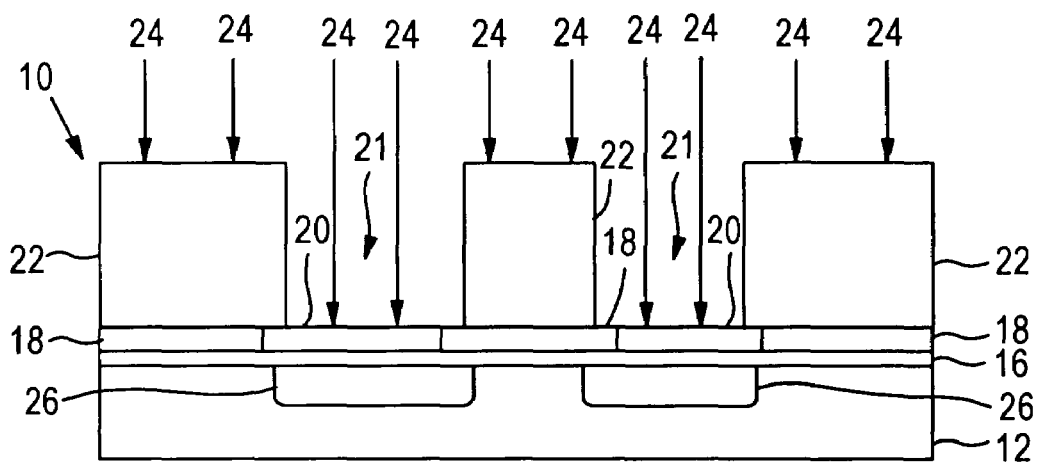

An impurity 24 of a second conductivity type is implanted at a first concentration through the two openings 21 into the substrate layer 12 to form a first portion of at least two wells 26. When a p-type substrate layer 12 is used, the implanted impurity 24 is n-type. FIG. 5 illustrates the formation of the first portion of the wells 26. In certain embodiments of the present invention, phosphorous ions 24 are implanted through the second insulating layer 20, silicon layer 18, and first insulating layer 16 into the substrate layer 12. The implantation of phosphorous ions into the substrate layer 12, also known as a current spreading implant, is performed at a dose of from about $2 \times 10^{13}$ $cm^{-2}$ to about $2 \times 10^{14}$ $cm^{-2}$ and at an energy in the range of from about 150 keV to about 250 keV.

Figure 6:
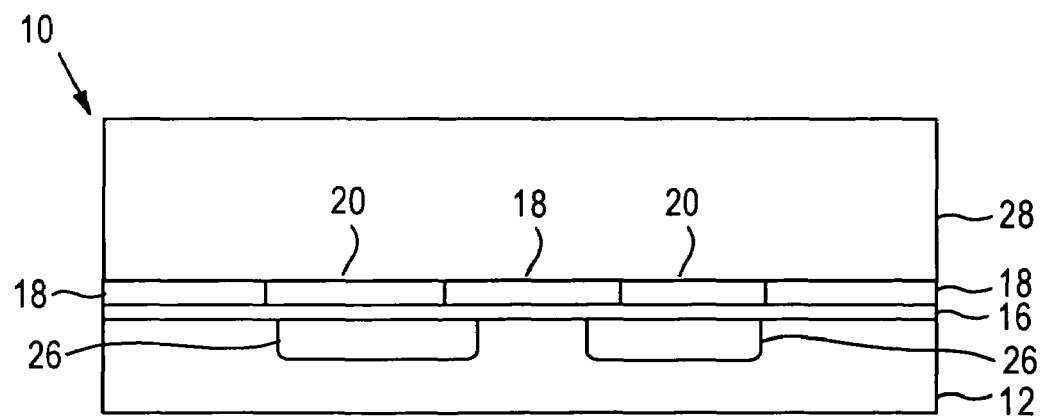
Figure 7:
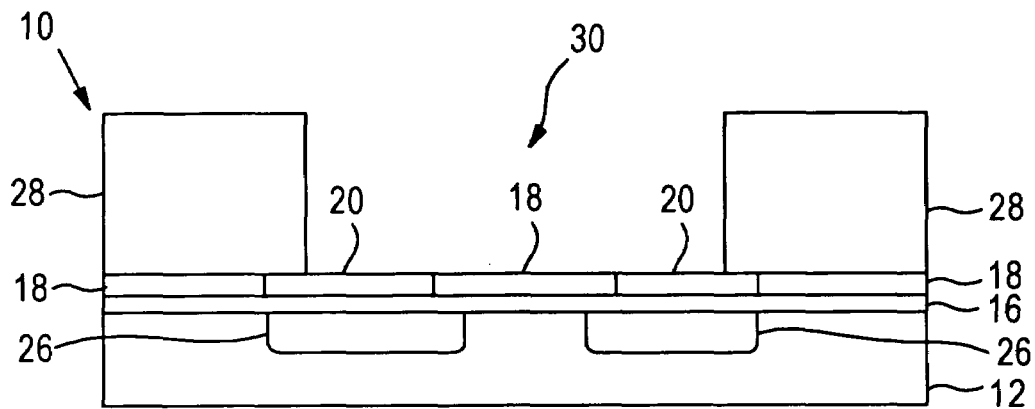

Subsequent to the formation of the first portion of the wells 26, the resist layer 22 is removed and a second resist layer 28 is formed overlying the second insulating 20 and silicon layer 18, as shown in FIG. 6. The resist layer 28 is patterned, as shown in FIG. 7, to produce opening 30 in the resist layer 28.

Figure 8:
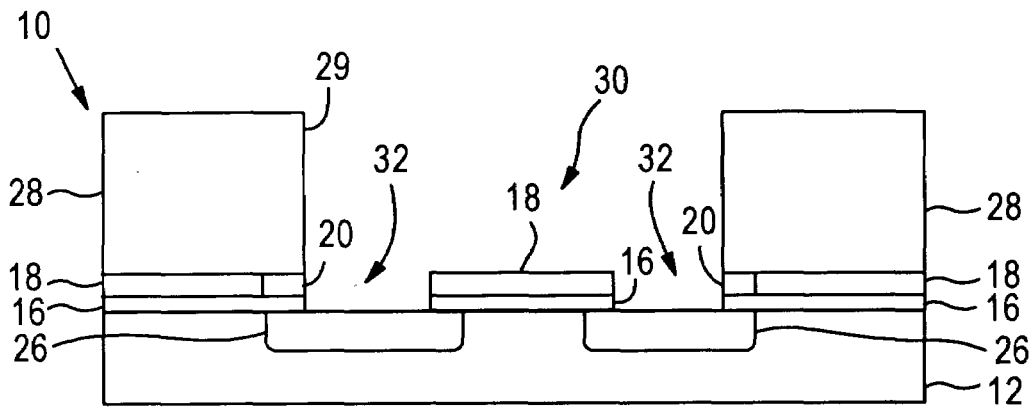

As shown in FIG. 8, an oxide selective etch, such as an anisotropic reactive ion etch, is performed to form openings 32 exposing the first portion of the wells 26. As a result of the resist layer 22 masking, a portion of the second insulting layer 20 remains along the sidewalls 29 of the opening 30 adjacent the silicon layer 18.

Figure 9:
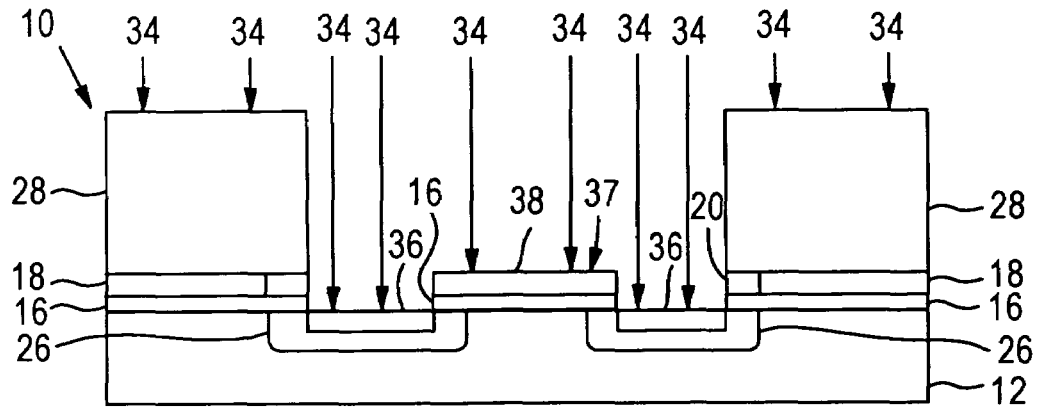

A second portion of the wells comprising source and drain regions 36 are formed in the wells 26 by implanting an impurity of the second conductivity type 34 at a second concentration. The concentration of the impurity 34 implanted into the second portion 36 is greater than the concentration of the impurity 24 implanted into the first portion 26 of the wells. In certain embodiments of the present invention, phosphorous or arsenic ions are suitable for forming the source and drain regions 36. In certain embodiments of the present invention, arsenic ions are implanted at a dose in the range of from about $1 \times 10^{15}$ $cm^{-2}$ to about $5 \times 10^{15}$ $cm^{-2}$ and at an energy in the range of from about 10 keV to about 30 keV. The steps of forming the openings 32 exposing the first portion of the wells 26 and subsequent implantation of impurity of the second conductivity type 34 also form a gate structure 37 comprising a gate insulating layer 16 and a gate conductive layer 38, as shown in FIG. 9. Gate conductive layer 38 comprises silicon layer 18 doped with an impurity of the second conductivity type 34 to render gate conductive layer 38 conductive.

Figure 10:
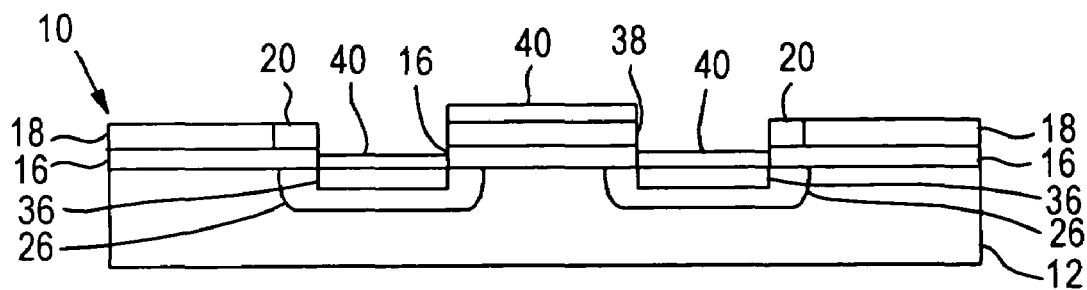

Metal silicide contacts 40 are subsequently formed on the source and drain regions 36 and the gate conductive layer 38. Conductive silicide layers 40 can be formed on the gate conductive layer 38 and source and drain regions 36 by depositing a metal over the semiconductor substrate 10 and subsequently annealing the semiconductor substrate 10 to react the metal with silicon in the source and drain regions 36 and the gate conductive layer 38 to form a metal silicide layer 40. The unreacted metal is subsequently removed from the semiconductor substrate 10, as shown in FIG. 10. Suitable metals for forming metal silicide layers include cobalt, nickel, titanium, tungsten, and tantalum. In order to activate source and drain regions 36, the semiconductor substrate 10 is annealed, such as by rapid thermal anneal, prior to forming the metal silicide layers 40 in certain embodiments of the present invention. In certain other embodiments of the present invention, the source and drain regions 36 are annealed and the metal silicide reaction occur simultaneously during a common heating step.

Figure 11:
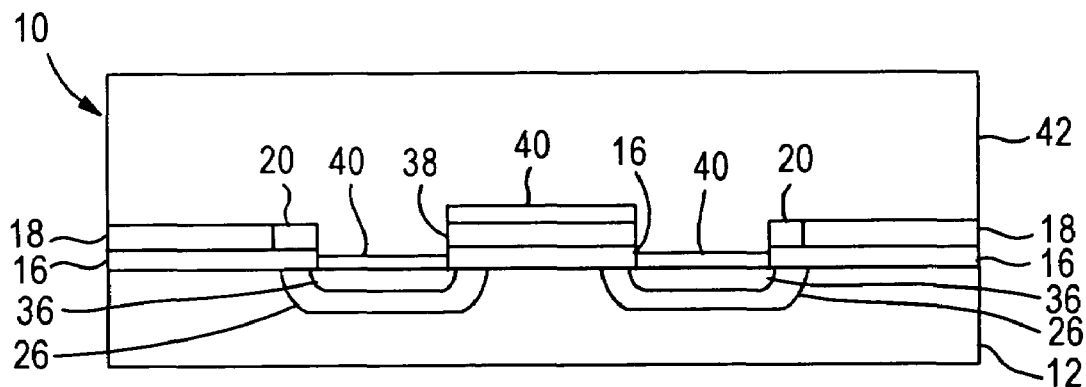
Figure 12:
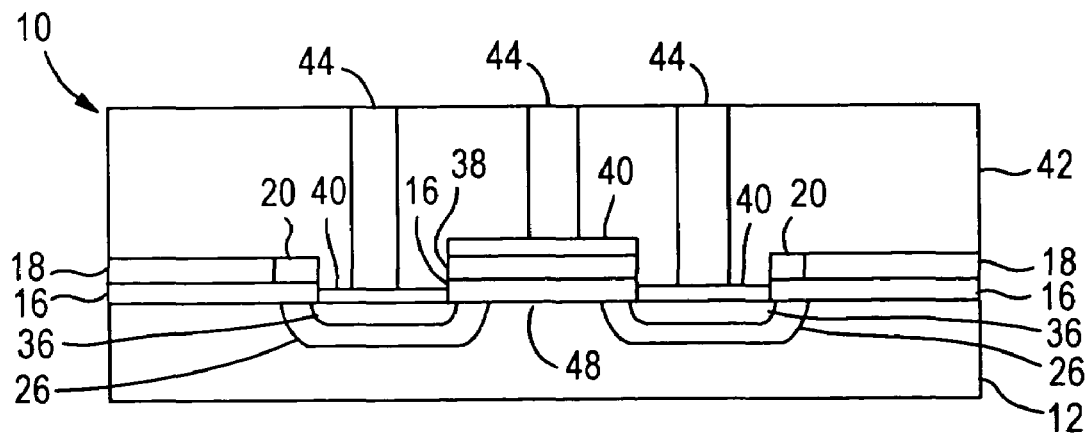

Conductive plugs 44 are formed to provide electrical contact to the source and drain regions 36 and the gate conductive layer 38 via the metal silicide contacts 40. As shown in FIG. 11, a third insulating layer 42 is formed over the semiconductor substrate 10. The third insulating layer 42, an interlayer dielectric, is patterned, such as by photolithographic patterning, to provide openings for the metal plugs 44, as illustrated in FIG. 12. In certain embodiments of the present invention, a metal, such as tungsten, is deposited in the openings to form the metal plugs 44. Other conductive materials that can be used to form the plugs 44 include aluminum, copper, and polysilicon. Metals such as tungsten, can be deposited by a physical vapor deposition process, such as sputtering. Chemical vapor deposition processes can also be used to deposit the conductive material. Subsequent to the deposition of the conductive material, the semiconductor substrate 10 is planarized, such as by chemical-mechanical polishing, to provide a structure for protecting the semiconductor device from electrostatic discharge 46.

Figure 13:
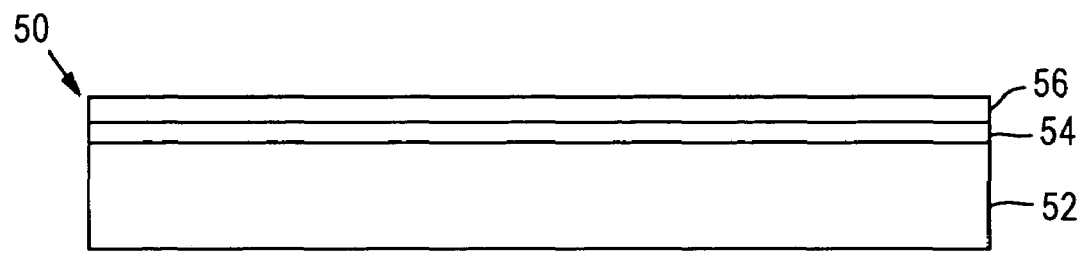
FIGS. 13–22 schematically illustrate the formation of a SOI semiconductor device comprising an electrostatic discharge protection structure according to another embodiment of the instant invention.
Figure 14:
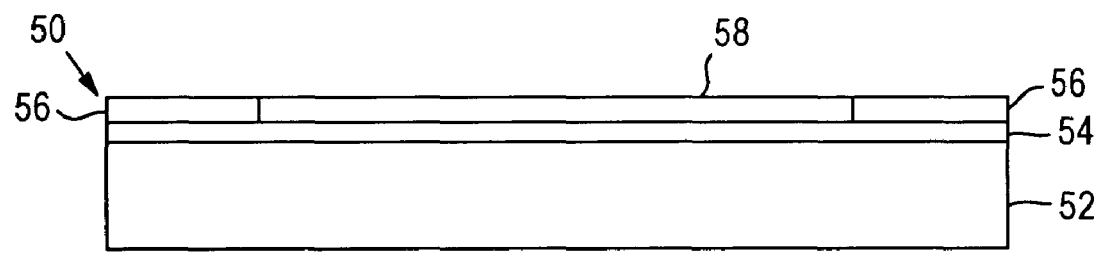
Figure 15:
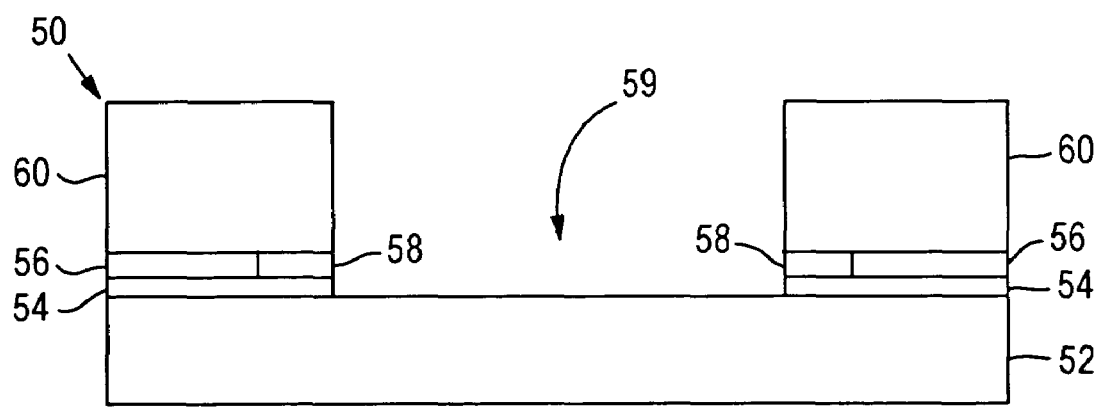

In another embodiment of the present invention, a SOI semiconductor substrate 50 is provided with a silicon layer 56 and a first insulating layer 54 overlying a substrate layer 52, as shown in FIG. 13. The substrate layer 52 can be a p-type silicon wafer and the first insulating layer 54 can be an oxide layer, such as a BOX layer. A second insulating layer 58 is formed in the silicon layer 56 to be substantially coplanar with the silicon regions in the silicon layer 56, as shown in FIG. 14. In certain embodiments of the present invention, STI techniques can be used to form the second insulating layer 58. A resist layer 60 is subsequently formed over the second insulating layer 58 and silicon layer 56. As shown in FIG. 15, the resist layer 60 is patterned, such as by photolithographic patterning, and the resulting opening 59 is extended into the second insulating layer 58 and first insulating layer 54, such as by anisotropic reactive ion etch, to expose the substrate layer 52.

Figure 16:
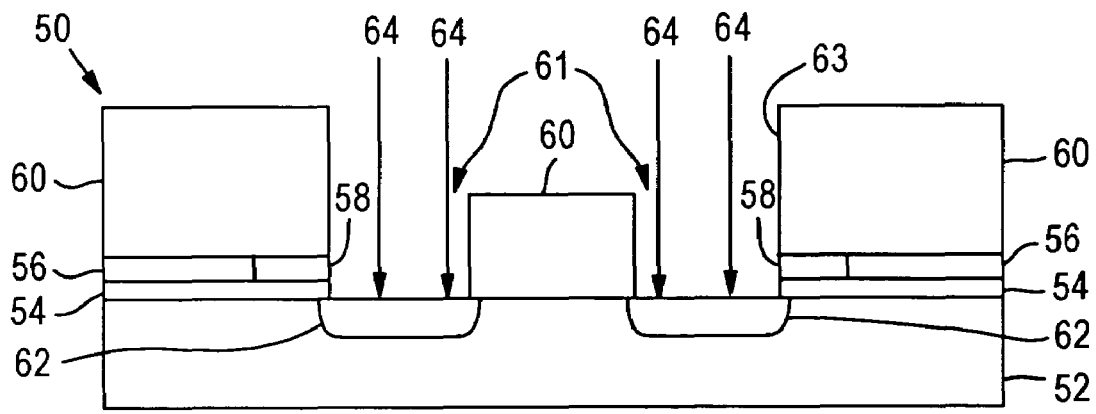

A resist layer 63 is subsequently deposited on the semiconductor substrate 50, as illustrated in FIG. 16. The resist layer 63 is patterned to form openings 61 through which an impurity of the second conductivity type 64 is implanted at a first concentration to form a first portion of the two wells 62. When a p-type substrate layer 52 is used, the impurity 64 is n-type, such as phosphorous or arsenic. In certain embodiments of the present invention, the impurity of the second conductivity type is phosphorous implanted at a dose of from about $2\times10^{13}$ cm$^{-2}$ to about $2\times10^{14}$ cm$^{-2}$ and an energy level of about 40 keV to about 75 keV. In certain embodiments of the present invention, the implant to form the first portion of the wells 62 is performed at an energy of from about 50 keV to about 60 keV.

Because the openings 61 had been formed in the second insulating layer 58 and the first insulating layer 54, the energy level of the implant to form the first portion of the wells is significantly less than the energy level required in embodiments where the impurity is implanted through the silicon layer, second insulating layer, and first insulating layers. A portion of the second insulating layer 58 remains along the sidewall 65 of openings 61 after the anisotropic etch to form openings 61.

Figure 17:
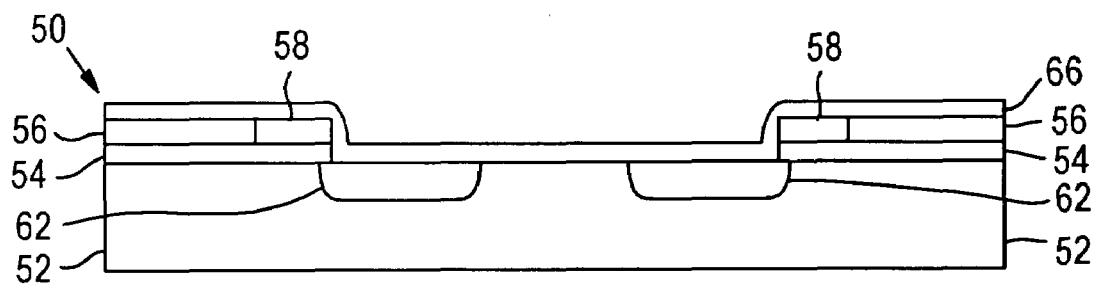

Subsequent to the step of implanting an impurity of the second conductivity type 64 at a first concentration, the resist layer 63 is removed, such as by stripping or ashing, and a fourth insulating layer 66 is deposited over the silicon layer 56, second insulating layer 58, wells 62, and substrate 52, as illustrated in FIG. 17. In certain embodiments of the present invention, the fourth insulating layer 66 is a silicon nitride layer. The thickness of the fourth insulating layer 66 is sufficient to block the subsequent implant of an impurity of the second conductivity type 68 from the region 67 between the first portion of the wells 62. In certain embodiments of the present invention, the thickness of the fourth insulating layer 66 is from about 1,000 Å to about 1,500 Å.

Figure 18:
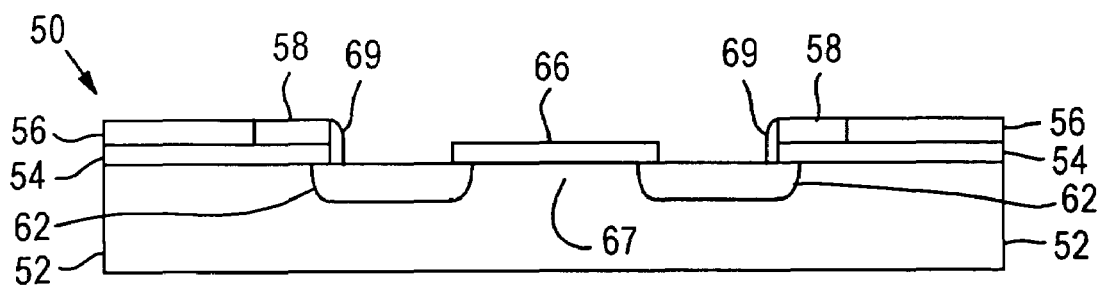
Figure 19:
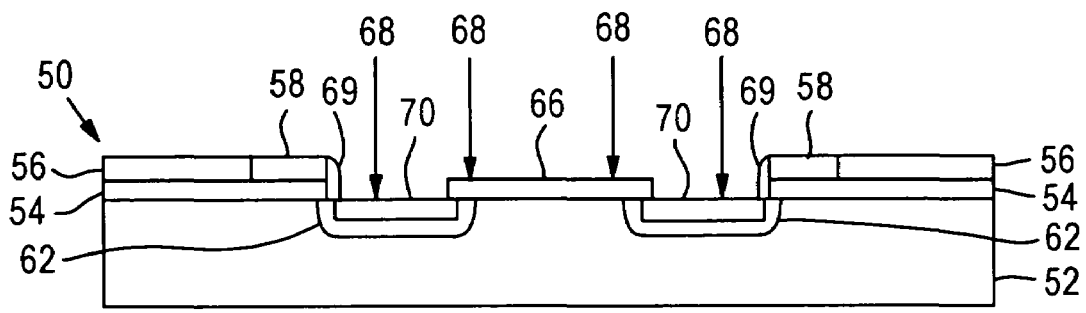

As shown in FIG. 18, the fourth insulating layer 66 is patterned, such as by forming a resist layer over the semiconductor substrate 50, photolithographic patterning the resist layer, and anisotropic etching of the fourth insulating layer 66 to leave a portion of the insulating layer 66 overlying the region between the wells 67, and sidewalls 69 formed along the second insulating layer 58 and the first insulating layer. A second impurity of the second conductivity type 68 is implanted at a second concentration to form the second portion of the wells 70. The second portion of the wells are source and drain regions 70 that are at a higher impurity concentration than the first portion 62 of the wells. In certain embodiments of the present invention, phosphorous or arsenic is implanted at a dose of from about $1\times10^{15}$ cm$^{-2}$ to about $5\times10^{15}$ cm$^{-2}$ and at an energy of from about 10 keV to about 30 keV. FIG. 19 illustrates the implantation of the second impurity of the second conductivity type 68 into the source and drain regions 70.

Figure 20:
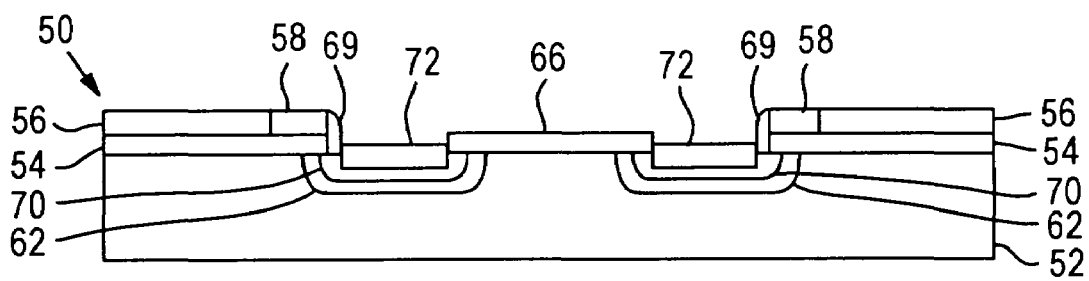

Metal silicide contacts 72 are formed on the source and drain regions 70 in the same manner as previously described. A metal layer is deposited, the semiconductor substrate is heated to react the metal with silicon, and the unreacted metal is removed leaving the metal silicide contacts 72 formed on the source and drain regions 70, as illustrated in FIG. 20.

Figure 21:
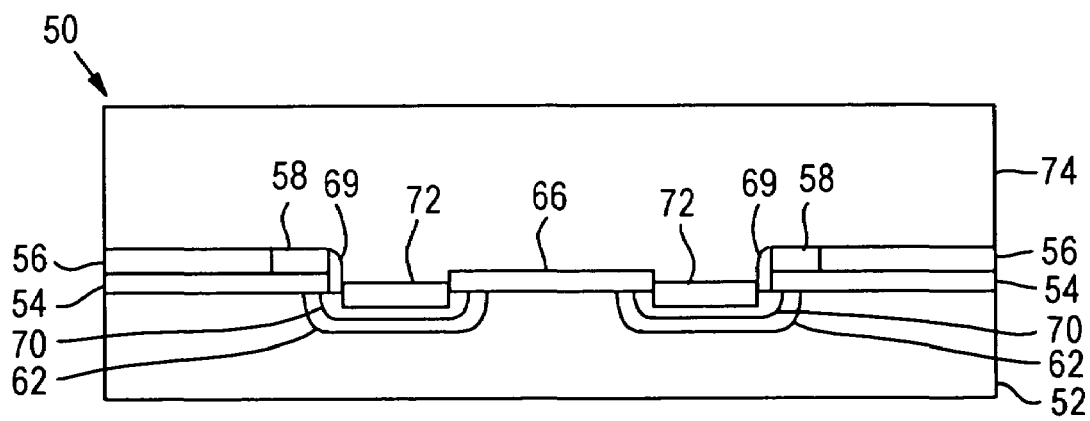
Figure 22:
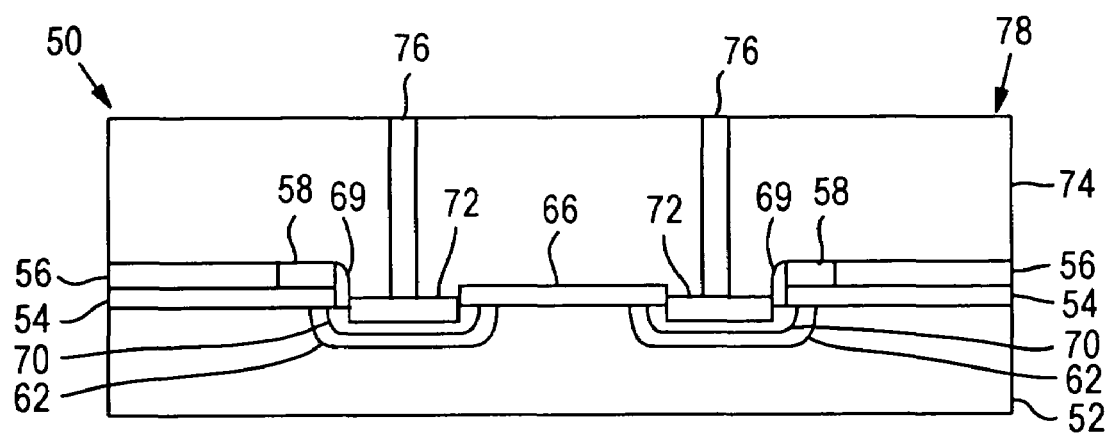

Metal plugs 76 are formed in the semiconductor substrate 50 by depositing a third insulating layer 74, such as an interlayer dielectric, over the semiconductor substrate 50, as shown in FIG. 21. As illustrated in FIG. 22, the third insulating layer 74 is subsequently patterned, such as photolithographic patterning and anisotropic etching to form openings, in which a conductive material 76 is deposited to form conductive plugs 76 in electrical contact with the source and drain regions 70 via the metal silicide contacts 72. In certain embodiments of the present invention, the conductive material can be tungsten, tantalum, aluminum, or polysilicon. Subsequent to the deposition of the metal plugs 76, the semiconductor substrate 50 is planarized to form a structure for protecting a semiconductor circuit from electrostatic discharge 78.

The embodiments of the present invention offer several improvements over prior art devices. Generally, an ESD protection structure is connected to all the input and output pads of the semiconductor device. The ESD protection devices of the present invention are an effective means for discharging current from an ESD and preventing oxide breakdown and punchthrough. The present invention also inhibits overheating in SOI devices by providing an effective means of thermal dissipation into the semiconductor substrate. Overheating in a typical SOI device, which is generally from about 500 Å to about 1,000 Å thick, decreases the device mobility and efficiency.

The NPN structures of the present invention are very stable devices because they are decoupled from devices on top of the SOI film. The first portion of the wells, the current spreading implant, improves functioning of the ESD device by spreading the current over a greater area, thus preventing current concentration in one location and the subsequent heating caused by the concentrated current.

The semiconductor device of the first embodiment of the instant invention includes a thick gate oxide field effect transistor in its structure. The oxide layer 16 can have a thickness of from about 100 nm to about 200 nm in certain embodiments of the present invention. The thickness of this gate oxide layer 16 provides good control over the breakdown voltage.

The structure for protection against electrostatic discharge formed according to other embodiments of the present invention that have openings in the first and second insulating layers allow the implant of the first impurity of the second conductivity type at a significantly lower energy level than the analogous implant of the first embodiment, in which the impurities are implanted through the first insulating layer and silicon layer.

In addition to protecting the semiconductor device from ESD, certain embodiments of the present invention can be used as a lateral NPN device.

The embodiments illustrated in the instant disclosure are for illustrative purposes only. They should not be construed to limit the claims. As is clear to one of ordinary skill in the art, the instant disclosure encompasses a wide variety of embodiments not specifically illustrated herein.

What is claimed is:

1. A structure for protecting a semiconductor device from electrostatic discharge comprising:
   a semiconductor substrate comprising:
   a substrate layer of a first conductivity type having two wells of a second conductivity type spaced laterally apart, wherein said wells each comprise a first portion having a first concentration of an impurity of said second conductivity type, and a second portion of one well comprises a source region and the second portion of the other well comprises a drain region, and the source and drain regions having a second concentration of an impurity of said second conductivity type, wherein said second concentration is greater than said first concentration;
   a first insulating layer formed over said substrate layer;
   a silicon layer comprising silicon regions formed over said first insulating layer;
   first and second conductive plugs extending through said silicon layer and first insulating layer in electrical contact with said source and drain regions, respectively.

2. The structure according to claim 1, wherein said silicon layer comprises at least one region of a second insulating layer formed substantially coplanar with said silicon regions.

3. The structure according to claim 2, further comprising a third insulating layer formed over said first and second insulating layers and surrounding said conductive plugs.

4. The structure according to claim 3, further comprising a gate structure overlying a region of the substrate between the two wells.

5. The structure according to claim 4, wherein said gate structure comprises a gate insulating layer formed from said first insulating layer and a gate conductive layer formed from said silicon layer.

6. The structure according to claim 5, further comprising a third conductive plug extending through said third insulating layer and in electrical contact with said gate conductive layer.

7. The structure according to claim 5, wherein said gate conductive layer is doped with an impurity of said second conductivity type.

8. The structure according to claim 5, further comprising a metal silicide layer interposed between said first and second conductive plugs and said source and drain regions; and
   between said third conductive plug and said gate conductive layer.

9. The structure according to claim 3, further comprising an insulating sidewall interposed between a vertical side of said first and second insulating layers, and said third insulating layer.

10. The structure according to claim 9, further comprising a fourth insulating layer overlying a region of the substrate between said wells.

11. The structure according to claim 10, wherein said insulating sidewalls and said fourth insulating layer are formed from a common layer of insulating material.

12. The structure according to claim 10, further comprising a metal silicide layer interposed between the first and second contact plugs and the source and drain regions.

13. A method of forming a structure for protecting a semiconductor circuit from electrostatic discharge comprising:
    providing a silicon-on-insulator semiconductor substrate comprising:
    a substrate layer of a first conductivity type;
    a silicon layer comprising silicon regions; and
    a first insulating layer interposed between said silicon layer and said substrate layer;
    forming two wells of a second conductivity type spaced laterally apart in said substrate layer, wherein said wells each comprise a first portion having a first concentration of an impurity of said second conductivity type;
    forming in said wells a second portion comprising source and drain regions having a second concentration of an impurity of said second conductivity type, wherein said second concentration is greater than said first concentration; and said source region is formed in one well and said drain region is formed in the other well;
    forming first and second conductive plugs, extending through said silicon layer and said first insulating layer, in electrical contact with said source and drain regions, respectively.

14. The method of forming a structure according to claim 13, wherein said silicon layer comprises at least one region of a second insulating layer formed substantially coplanar with said silicon regions.

15. The method of forming a structure according to claim 14, further comprising forming a third insulating layer over the first insulating layer, second insulating layer, and source and drain regions prior to forming the conductive plugs.

16. The method of forming a structure according to claim 14, wherein the step of forming two wells of a second conductivity type spaced laterally apart in said substrate layer comprises:
    selectively implanting an impurity of a second conductivity type into the substrate layer through said silicon layer, second insulating layer, and first insulating layer to form said first portion of the wells, wherein said first portion has a first concentration of an impurity of said second conductivity type;

forming openings in the second insulating layer and first insulating layer to expose the first portion of the wells, wherein a portion of said second insulating layer remains at a sidewall of said openings adjacent the silicon layer; and implanting an impurity of the second impurity type at a second concentration into the substrate layer through said openings to form said source and drain regions.

17. The method of forming a structure according to claim 16, further comprising forming a gate structure overlying a region between said two wells, wherein said step of forming openings in the silicon layer, second insulating layer, and first insulating layer forms a gate structure comprising a gate insulating layer overlying the region between said wells, said gate insulator being formed from said first insulating layer; and a gate conductive layer overlying said gate insulating layer, said gate conductive layer being formed from said silicon layer.

18. The method of forming a structure according to claim 17, wherein said step of implanting an impurity of a second conductivity type at a second concentration includes implanting said impurity of a second conductivity type in said gate conductive layer.

19. The method of forming a structure according to claim 18, further comprising forming a metal silicide layer on said source and drain regions and gate conductive layer, wherein the step of forming said metal silicide layer comprises:

depositing a metal layer over said source and drain regions and gate conductive layer;

reacting the metal layer with silicon in the source and drain regions and gate conductive layer to form the metal silicide layer; and removing the unreacted metal.

20. The method of forming a structure according to claim 19, wherein the metal plugs are formed by the steps of:

forming a third insulating layer over the silicon layer, second insulating layer, and metal silicide layer;

forming openings in the third insulating layer to expose a portions of said metal silicide layer overlying the source and drain regions and the gate conductive layer; and depositing conductive material in said openings in the third insulating layer.

21. The method of forming a structure according to claim 14, wherein the step of forming two wells of a second conductivity type spaced laterally apart in said semiconductor substrate comprises:

forming an opening in the second insulating layer and first insulating layer to expose the substrate, wherein a portion of said second insulating layer remains at a sidewall of said opening adjacent the silicon layer;

selectively implanting an impurity of a second conductivity type into the substrate to form said first portion of the wells, wherein said first portion has a first concentration of an impurity of said second conductivity type;

forming a fourth insulating layer over the silicon layer, second insulating layer, substrate, and the wells;

patterning the fourth insulating layer to form openings exposing a portion of the wells, sidewalls along the opening in the second insulating layer and first insulating layer, and an insulating layer overlying a region of the substrate between the wells;

implanting an impurity of the second impurity type at a second concentration into the substrate through said openings exposing a portion of the wells to form said source and drain regions.

22. The method of forming a structure according to claim 21, further comprising forming a metal silicide layer on said source and drain regions, wherein the step of forming said metal silicide layer comprises:

depositing a metal layer over said source and drain regions;

reacting the metal layer with the source and drain regions layer to form the metal silicide layer; and removing the unreacted metal.

23. The method of forming a structure according to claim 22, wherein the metal plugs are formed by the steps of:

forming a third insulating layer over the silicon layer, second insulating layer, fourth insulating layer, and metal silicide layer;

forming openings in the third insulating layer to expose portions of said metal silicide layer overlying the source and drain regions; and depositing conductive material into said openings in the third insulating layer.

* * * * *